United States Patent [19]

Ozawa

[11] 4,281,259
[45] Jul. 28, 1981

[54] DIGITAL PHASE COMPARING APPARATUS

[75] Inventor: Toshiyuki Ozawa, Gunma, Japan

[73] Assignees: Sanyo Electric Co., Ltd., Osaka; Tokyo Sanyo Electric Co., Ltd., Gunma, both of Japan

[21] Appl. No.: 54,974

[22] Filed: Jul. 5, 1979

[30] Foreign Application Priority Data

| Nov. 8, 1978 | [JP] | Japan | 53-139135 |
| Nov. 8, 1978 | [JP] | Japan | 53-139136 |
| Feb. 2, 1979 | [JP] | Japan | 54-11762 |
| Feb. 2, 1979 | [JP] | Japan | 54-11763 |
| Feb. 5, 1979 | [JP] | Japan | 54-12472 |

[51] Int. Cl.$^3$ ............................. H03K 5/26; H03L 7/18
[52] U.S. Cl. ..................................... 307/514; 307/528; 307/579; 307/246; 307/247 R; 331/1 A; 328/133
[58] Field of Search ............... 307/232, 246, 247, 208, 307/251; 328/133, 134; 331/1 A

[56] References Cited

U.S. PATENT DOCUMENTS

| 3,610,954 | 10/1971 | Treadway | 307/232 |
| 3,641,443 | 2/1972 | Zerby | 307/232 |
| 3,714,463 | 1/1973 | Laune | 307/232 |
| 4,122,405 | 10/1978 | Tietz | 331/1 A |

Primary Examiner—John S. Heyman
Attorney, Agent, or Firm—Darby & Darby

[57] ABSTRACT

A digital phase comparator, to be used in a phase locked loop, for example, comprises a first and second input signal terminals receiving a first and second input signals, respectively, the phases of which are to be compared, and a pair of first and second delay flip-flops. The first input signal terminal is connected to a clock terminal of the first delay flip-flop and a reset or set terminal of the second delay flip-flop. The second input terminal is connected to a set or reset terminal of the first delay flip-flop and a clock terminal of the second delay flip-flop. An inverted or non-inverted output terminal of the first delay flip-flop is connected to a data terminal of the second delay flip-flop. An inverted or non-inverted output terminal of the second delay flip-flop is connected to a data terminal of the first delay flip-flop. An output signal associated with the phase difference between the first and second input signals is obtained from the output terminals of the first and second delay flip-flops.

24 Claims, 22 Drawing Figures

FIG. 6
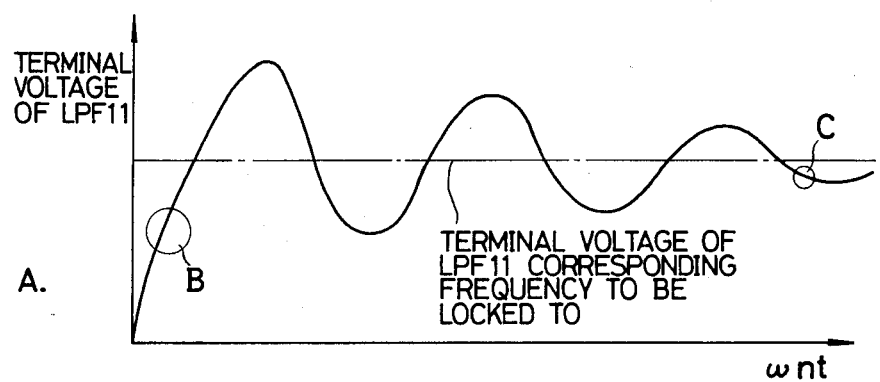
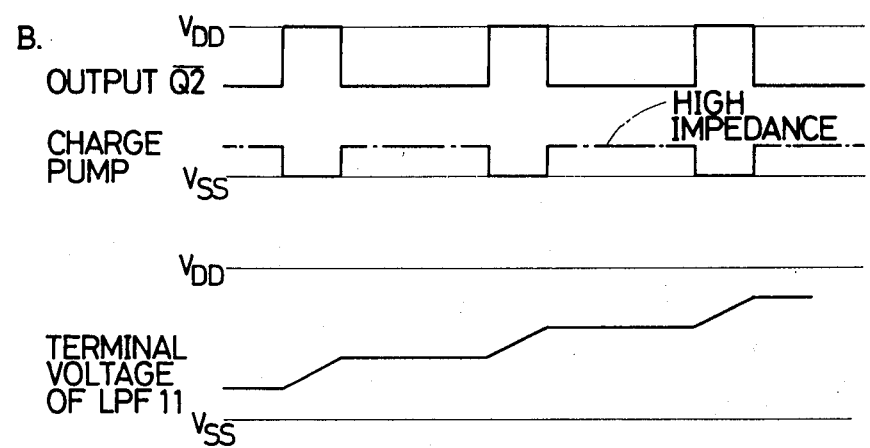
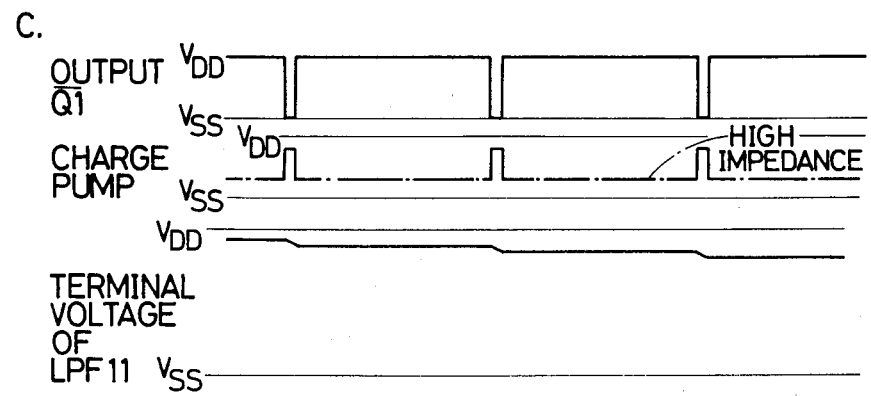

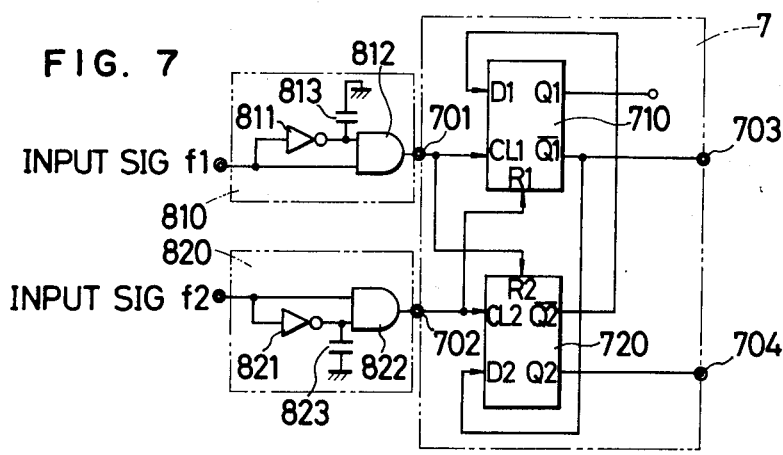
FIG. 7
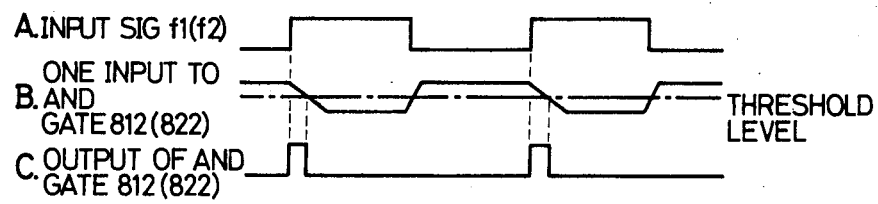
FIG. 8
FIG. 12

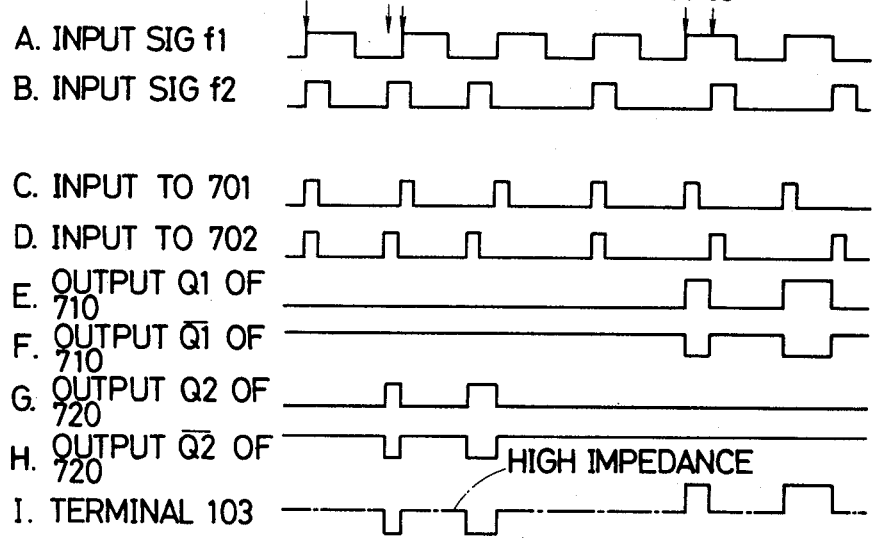
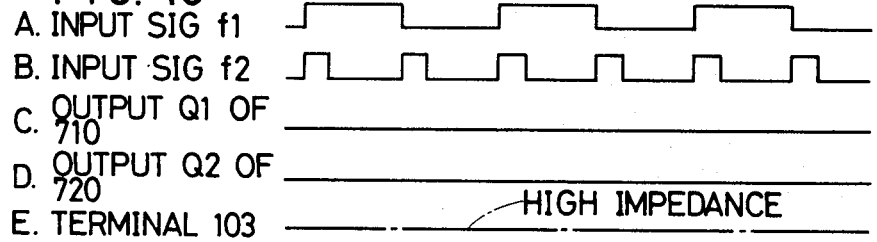
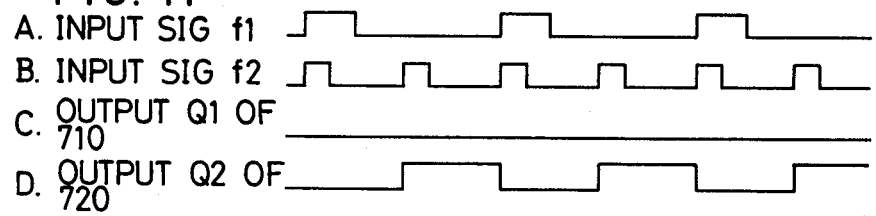

DIGITAL PHASE COMPARING APPARATUS

BACKGROUND OF THE INVENTION

1. Field of the Invention

The present invention relates to a digital phase comparing apparatus, and more specifically to a digital phase comparing apparatus for use in, for example, a digital frequency synthesizer having a phase locked loop employed in a citizen band transceiver, a television receiver, a radio receiver and the like.

2. Description of the Prior Art

Recently radio receivers employing a so-called digital frequency synthesizer using a phase locked loop as a local oscillator have been proposed and put in practical use. FIG. 1 shows a block diagram of such a radio receiver employing a digital frequency synthesizer as a local oscillator. Referring to FIG. 1, a tuning and detecting circuit 2 is connected to receive a high frequency signal received by an antenna 1 and to provide an audio signal output. The tuning and detecting circuit 2 is structured to comprise a voltage controlled oscillator 3 as a local oscillator. The output signal from the tuning and detecting circuit 2 is applied to an audio amplifier 4, where the signal is amplified. The output of the audio amplifier 4 is applied to a speaker 5. As well known, in a digital frequency synthesizer radio receiver, a local oscillator is implemented by a voltage controlled oscillator, which is connected to constitute a phase locked loop such that the oscillation frequency is controlled by the phase locked loop.

The phase locked loop shown in FIG. 1 comprises a phase comparator 7 structured to compare the phase of the output of a frequency divider 8 the frequency of which is f1 and the phase of the output of a programmable frequency divider 6 the frequency of which is f2. The frequency divider 8 is structured to frequency divide at a frequency division ratio $1/n$ the output of a reference oscillator 9 to provide a frequency signal of the frequency f1. The programmable frequency divider 6 is structured to frequency divide at a variable frequency division ratio $1/N$ the output of the above described voltage controlled oscillator 3 included in the tuning and detecting circuit 2 to provide a frequency signal of the frequency f2. The phase comparator serves to provide a voltage signal proportional to the phase difference between the above described two frequency signals f1 and f2 to a charge pump 10. The output of the charge pump 10 is fed back through a low-pass filter 11 to the above described voltage controlled oscillator 3 as a control voltage. The programmable frequency divider is provided such that the local oscillation frequency, i.e. the oscillation frequency of the voltage controlled oscillator 3 is variable in association with a channel selected by a channel selector 13. More specifically, the data concerning the broadcasting frequencies of various broadcasting stations is in advance stored in a memory 12 and the data corresponding to the broadcasting frequency of a desired broadcasting station is selectively read from the memory 12 responsive to selection of a desired channel by means of the channel selector 13. The data read from the memory 12 is set in the programmable frequency divider 6 as a frequency division ratio. The channel thus selected by the channel selector 13 may be displayed by means of a display 14, as necessary.

The present invention relates to a phase comparator for use in such a digital frequency synthesizer. Various circuit configurations have been heretofore proposed as such a phase comparator. A prior art phase comparator of interest to the present invention is seen, for example, in U.S. Pat. No. 3,610,954, issued Oct. 5, 1971 to Ronald L. Treadway, entitled "PHASE COMPARATOR USING LOGIC GATES" and U.S. Pat. No. 3,714,463, issued Jan. 30, 1973 to Jon M. Laune, entitled "DIGITAL FREQUENCY AND/OR PHASE DETECTOR CHARGE PUMP". A counterpart British patent corresponding to the above described U.S. Pat. No. 3,610,954 has been granted as British Pat. No. 1,328,031.

FIG. 2 shows a schematic diagram of a prior art phase comparator disclosed in the above referenced U.S. Pat. No. 3,610,954. As seen from FIG. 2, the above referenced U.S. Pat. No. 3,610,954 comprises a circuit configuration, wherein for the purpose of signal detection one signal is applied to a NAND gate 74 through a NAND gate 71 while the other signal is applied to a NAND gate 74 through NAND gates 71' and 75. Thus, according to the prior art phase comparator as shown in FIG. 2, a disadvantage is encountered that a connection path for signal detection becomes long and hence stray capacitance becomes large. Furthermore, since the prior art phase comparator shown employs multiple input gates such as the NAND gates 74, 74' and 75, the input capacitance becomes accordingly large. Because of the above described large stray capacitance and input capacitance, a signal is so much delayed that a small phase difference can be hardly detected. Accordingly a so-called spike phenomenon is liable to occur wherein a p-channel MOS transistor 104 and an n-channel MOS transistor 105 of the charge pump 10 becomes simultaneously conductive. On the other hand, as shown in FIG. 2, the charge pump 10 are typically implemented by CMOS field-effect transistors; however, employment of CMOS field-effect transistors in the charge pump 10 necessitates employment of an inverter 106 between the NAND gate 74' and the gate of the n-channel MOS transistor. The reason is that a circuit configuration concerning the NAND gate 74 and the circuit configuration concerning the NAND gate 74' are structured in a symmetrical manner. Furthermore, if and when the charge pump 10 is implemented by CMOS field-effect transistors, as shown in FIG. 2, then a small signal corresponding to a small frequency difference does not exceed an input threshold voltage of the inverter 106, inasmuch as such input threshold voltage is approximately $\frac{1}{2} V_{DD}$. Accordingly, the charge pump 10 becomes irresponsive to an input signal, which makes it impossible to detect a small phase difference. Thus, according to a conventional phase comparator as shown in FIG. 2, the sensitivity of phase detection becomes low and it follows that a carrier to noise ratio of the phase locked loop and thus a signal to noise ratio of a radio receiver is degraded. Furthermore, assuming that such a conventional phase comparator as shown in FIG. 2 is implemented by way of large scale integration, the circuit pattern becomes complicated, inasmuch as the prior art shown is of a random gate type. The problem of complicated circuit pattern is aggravated by an increased number of devices in the circuit.

FIG. 3 shows a schematic diagram of the prior art phase comparator disclosed in the above referenced U.S. Pat. No. 3,714,463. The phase comparator shown in FIG. 3 comprises two flip-flops 76 and 76' and three NOR gates 77, 78 and 78'. Since the FIG. 3 phase comparator is structured such that coincidence or non-coincidence of the outputs of two J-K flip-flops 76 and 76' is detected and is fed back, a coincidence gate, i.e. the NOR gate 77, is necessarily required. The prior art phase comparator shown in FIG. 3 still requires a larger number of devices, which makes the signal detection path long and accordingly is liable to cause a loss of the signal.

SUMMARY OF THE INVENTION

Briefly described, the present invention employs two signal processing circuit means. Each signal processing circuit means has first, second and third input terminals and first and second output terminals and is structured such that the same is responsive to a signal obtained at the first input terminal to transfer a signal obtained at the third input terminal to the first output terminal and is responsive to a signal obtained at the second input terminal to force the first and second output terminals to a logical state predetermined by the signal obtained at the second input terminal. Two input signals the phases of which are to be compared are applied to the first input terminal of each of the signal processing circuit means. One input signal the phase of which is to be compared is further applied to the second input terminal of the second signal processing circuit means and the other input signal is applied to the second input terminal of the first signal processing circuit means. The signal obtained at the first output terminal of the first signal processing circuit means is applied to the third input terminal of the second signal processing circuit means and the signal obtained at the first output terminal of the second signal processing circuit means is applied to the third input terminal of the first signal processing circuit means.

According to an embodiment of the present invention, each of the first and second signal processing circuit means comprises a delay flip-flop. A charge/discharge controlling circuit is implemented by CMOS field-effect transistors, wherein the second output terminal of the first signal processing circuit means is directly connected to the gate electrode of the p-channel field-effect transistor and the second output terminal of the second signal processing circuit means is directly connected to the gate electrode of the n-channel field-effect transistor. The junction of the series connection of the p-channel field-effect transistor and the n-channel field-effect transistor is connected to a time constant circuit means. One end of the series connection of the p-channel field-effect transistor and the n-channel field-effect transistor is connected to a first reference potential and the other end of the series connection of the p-channel field-effect transistor and the n-channel field-effect transistor is connected to a second reference potential.

According to the present invention, a phase comparator for detecting a phase difference between two input signals is essentially structured by a combination of only two signal processing circuit means, which makes the signal detection path shorter and thus enables withdrawal of a minor signal corresponding to a minor phase difference with accuracy. Since these two signal processing circuit means can be structured in a non-symmetrical manner, the output thereof can be directly connected to the control electrode of the semiconductor switching devices of the charge/discharge controlling circuit. Therefore, detection sensitivity is enhanced and a phase locked loop having a higher carrier to noise ratio than the prior art can be provided. In addition, if the circuit means is structured in a non-symmetrical type, CMOS field-effect transistors may be utilized in the charge/discharge controlling circuit without necessity of an inverter as in case of the prior art, with the result that the detection sensitivity can be prevented from being lowered by virtue of an inverter. Generally, such a phase comparator necessitates a provision of the circuit for preventing the same from being locked to a harmonic and a conventional phase comparator has employed such a circuit within the circuit of the phase comparator per se. However, according to the present invention, a circuit portion for preventing the comparator from being locked to a harmonic can be provided outside of the phase comparator. Therefore, according to the present invention, a phase comparator per se can be structured in a simple circuit configuration. In other words, any function for preventing the comparator from being locked to a harmonic can be processed in a digital manner at the stage preceding the phase comparator per se.

Therefore, a principal object of the present invention is to provide an improved digital phase comparing apparatus.

Another object of the present invention is to provide a digital phase comparing apparatus of a simplified structure.

A further object of the present invention is to provide a digital phase comparing apparatus, wherein a signal detection path of the circuit pattern can be made shorter, circuit pattern capacitance and input capacitance can be decreased, and a small voltage corresponding to a small phase difference does not disappear.

Still a further object of the present invention is to provide a digital phase comparing apparatus suited for implementation by way of an integrated circuit.

These objects and other objects, features, aspects and advantages of the present invention will become more apparent from the following detailed description when taken in conjunction with the accompanying drawings.

BRIEF DESCRIPTION OF THE DRAWINGS

FIG. 6 is a graph showing how the phase locked loop is converged and locked to a given frequency;

FIG. 7 is a block diagram showing a further embodiment of the present invention;

FIGS. 8 to 11 are graphs showing an example of waveforms of electrical signals at various portions of the FIG. 7 embodiment for explaining the operation thereof;

FIG. 12 is a block diagram showing still a further embodiment of the present invention;

DESCRIPTION OF THE PREFERRED EMBODIMENTS

Figure 4:
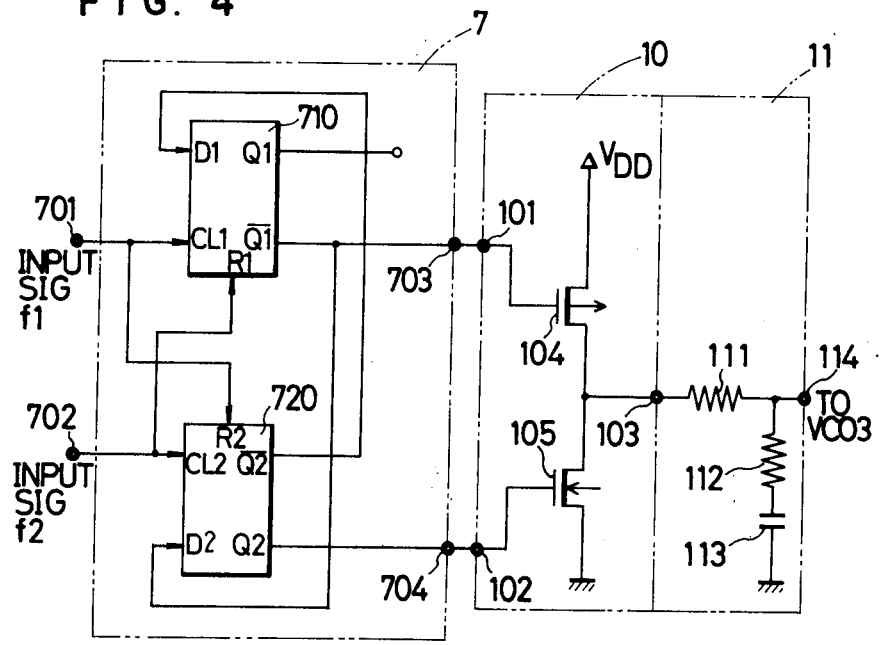
FIG. 4 is a block diagram showing one embodiment of the present invention.

FIG. 4 is a block diagram showing one embodiment of the present invention. Referring to FIG. 4, a phase comparator 7 has two input signal terminals 701 and 702 and two output terminals 703 and 704. The phase comparator 7 also comprises two delay flip-flops 710 and 720. The delay flip-flops 710 and 720 have clock terminals CL1 and CL2 serving as the first input terminal, reset terminals R1 and R2 serving as the second input terminal, data terminals D1 and D2 serving as the third input terminal, output terminals Q1 and Q2 serving as the first output terminals and output terminals $\overline{Q1}$ and $\overline{Q2}$ serving as the second output terminals, respectively. The clock terminal CL1 of the delay flip-flop 710 is connected to the above described first input signal terminal 710 and the above described first input signal terminal 710 is further connected to the reset terminal R2 of the second delay flip-flop 720. The second input signal terminal 702 is connected to the clock terminal CL2 of the delay flip-flop 720 and the reset terminal R1 of the delay flip-flop 710. The output terminal $\overline{Q1}$ of the first delay flip-flop 710 is connected to the data terminal D2 of the second delay flip-flop 720. The output terminal $\overline{Q2}$ of the second delay flip-flop 720 is connected to the data terminal D1 of the first delay flip-flop 710. The output terminal $\overline{Q1}$ of the delay flip-flop 710 is further connected to the output terminal 701 of the phase comparator 7. The output terminal Q2 of the delay flip-flop 720 is connected to the output terminal 704 of the phase comparator 7.

Figure 2:
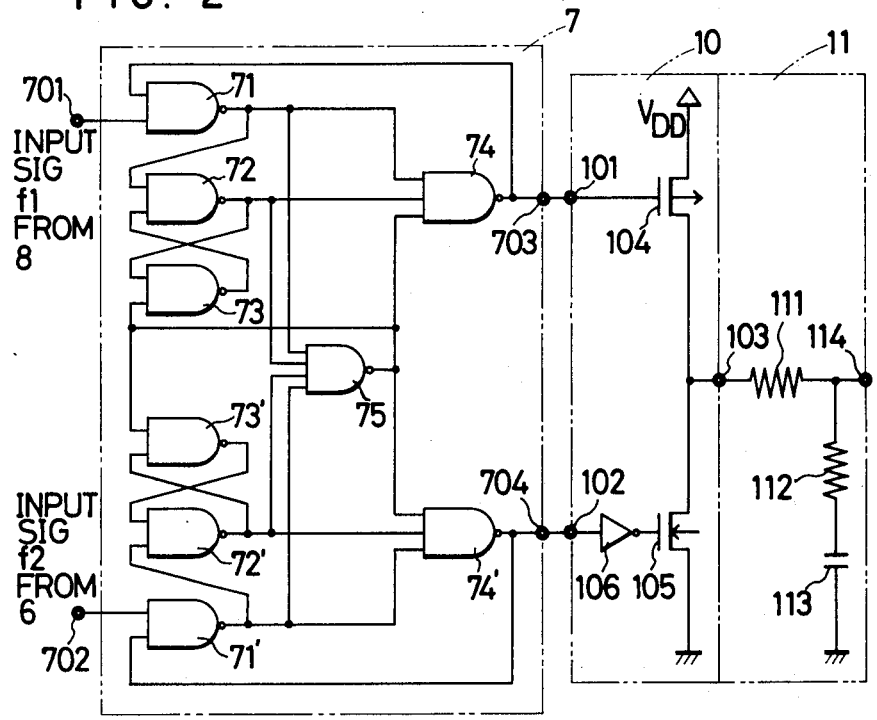
FIG. 2 is a block diagram showing one example of a prior art phase comparator of interest to the present invention.
Figure 3:
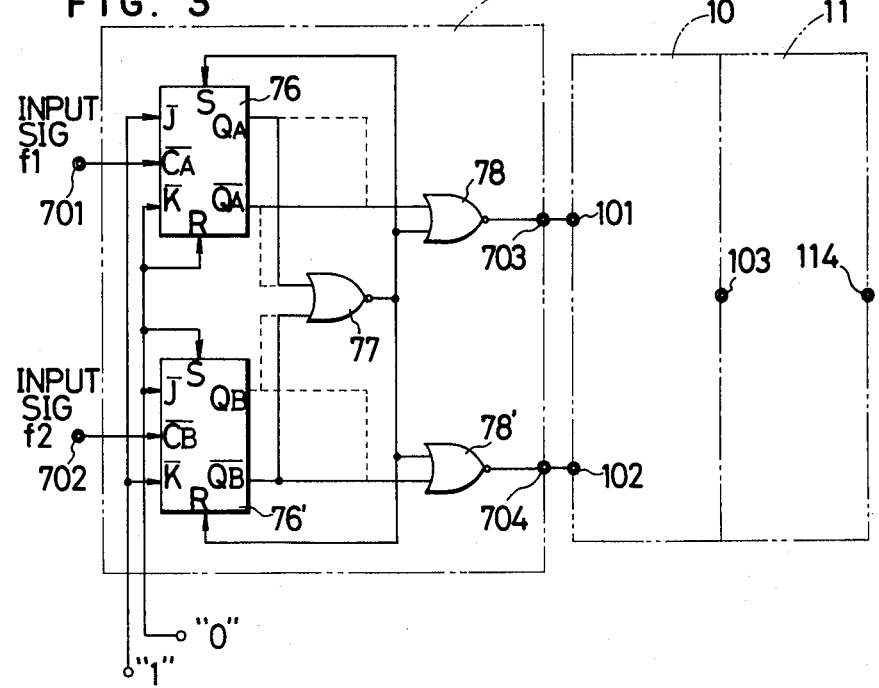
FIG. 3 is a block diagram showing another example of a prior art phase comparator of interest to the present invention.

The charge pump 10 comprises a series connected p-channel field-effect transistor 104 and n-channel field-effect transistor 105, as in case of the FIG. 2 comparator. One end of the series connection of the p-channel field-effect transistor 104 and the n-channel field-effect transistor 105 is connected to a first reference potential, such as $V_{DD}$, while the other end of the series connection of the p-channel field-effect transistor 104 and the n-channel field-effect transistor 105 is connected to a second reference voltage, such as a ground line. The junction of the above described series connection of these field effect transistors 104 and 105 is further connected through resistors 111 and 112 included in a low-pass filter 11 to one end of a capacitor 113 serving as a time constant circuit means. The other end of the capacitor 113 is connected to the ground. The terminal voltage of the low-pass filter 11 is applied to the output terminal 114, whereby a voltage associated with a phase difference between two input signals is supplied.

The truth tables of the delay flip-flops 710 and 720 used in the embodiment shown are shown in TABLE 1. Referring to the TABLE 1, the operation of the delay flip-flops will be briefly described. A delay flip-flop is, for example, responsive to a rise of the clock pulse fed to the clock terminal CL to be operable and irresponsive to the fall of the clock pulse to cause no change in the output Q. If and when the signal fed to the data terminal D is the logic one on the occasion of the rise of the clock CL, the output Q of the flip-flop also becomes the logic one. If and when the signal fed to the data terminal D is the logic zero on the occasion of the rise of the clock CL, the output Q also becomes the logic zero.

With the above described operation of the delay flip-flop in mind, the operation of the FIG. 4 embodiment will be described with reference to FIG. 5. Let it be assumed that the input signal terminals 701 and 702 of the delay flip-flops 710 and 720 are supplied with the input signals as shown as A and B in FIG. 5, respectively. Let it be further assumed that the input signals f1 and f2 of the same phase are applied to the input signal terminals 701 and 702 as at the time t1 shown in FIG. 5. The input signal f1 is applied to the clock terminal CL1 of the delay flip-flop 710 and to the reset terminal R2 of the delay flip-flop 720, while the input signal f2 is applied to the reset terminal R1 of the delay flip-flop 710 and to the clock terminal CL2 of the delay flip-flop 720. Accordingly, the first and second delay flip-flops 710 and 720 are reset. Accordingly, the outputs Q1 and Q2 both become the logic zero, while the outputs $\overline{Q1}$ and $\overline{Q2}$ both become the logic one. Therefore, the p-channel field-effect transistor 104 included in the charge pump 10 becomes non-conductive and the n-channel field-effect transistor 105 of the charge pump 10 also becomes non-conductive. Accordingly, the charge pump 10 exhibits a high impedance. The capacitor 113 included in the low-pass filter does not perform either a discharging operation or a charging operation in the above described high impedance state.

Figure 5:
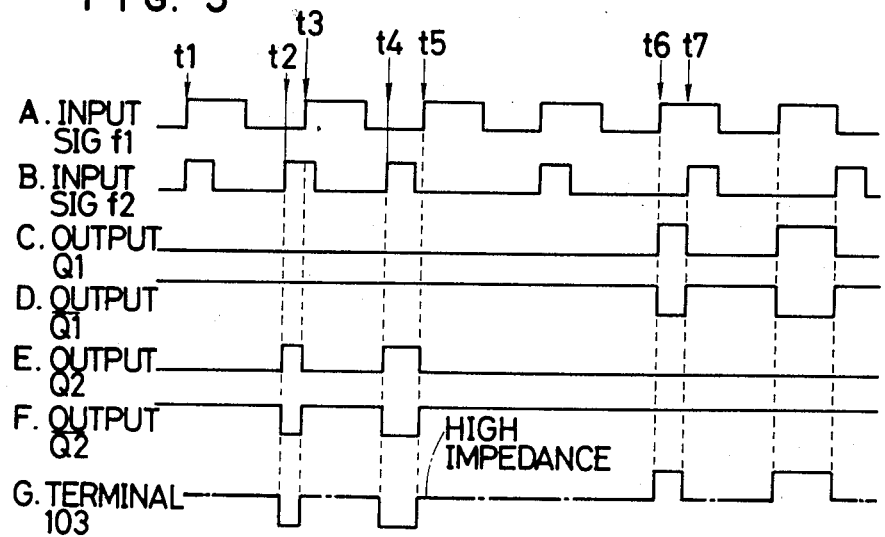
FIG. 5 is a graph showing an example of waveforms of signals at various portions of the FIG. 4 embodiment for explaining the operation thereof.

If and when the phase of the input signal f2 advances and the input signal f2 rises, as at the time t2 shown in FIG. 5, the output terminal Q2 of the second delay flip-flop 720 becomes the logic one. Since in such a state the clock terminal CL1 of the first delay flip-flop 710 is not supplied with the rise of the input signal f1, the output terminal Q1 of the flip-flop 710 remains the logic zero and the output terminal $\overline{Q1}$ of the flip-flop 710 remains the logic one. Accordingly, the n-channel field-effect transistor 105 included in the charge pump 10 is rendered conductive in such a state, while the p-channel field-effect transistor 104 of the charge pump 10 remains non-conductive. Accordingly, the capacitor included in the low-pass filter 11 is discharged through the resistors 112 and 111 and the n-channel field-effect transistor 105. With the input signal f2 as a logic one, even if the input signal f1 rises to the logic one, such as shown at time t3, the first delay flip-flop 710 has been reset by the previous input signal f2 and the output terminal thereof Q1 remains the logic zero. On the other hand, the delay flip-flop 720 is responsive to the rise of the input signal f1 to be reset and at that time the output terminal Q2 thereof becomes the logic zero. Accordingly, the n-channel field-effect transistor 105 included in the charge pump 10 is again returned to the non-conductive state. In other words, during a time period when the output Q2 of the delay flip-flop 720 is the logic one, the capacitor 113 included in the low-pass filter 11 is discharged.

When the input signal f2 again rises at the time t4 shown in FIG. 5, the output terminal Q2 of the second delay flip-flop 720 becomes the logic one. When the input signal f1 rises as at the time t5 shown in FIG. 5, after the input signal f2 changes from the logic one to the logic zero, the second delay flip-flop 720 is supplied with a reset signal thereby, so that the output terminal Q2 thereof becomes the logic zero. Although the clock terminal CL1 of the first delay flip-flop 710 is supplied with the rise of the input signal f1, the delay flip-flop 710 has been receiving at the data terminal the logic zero obtained at the output terminal $\overline{Q2}$ before the delay flip-flop 720 is reset, so that the output terminal Q1 thereof remains the logic zero. Thus, the p-channel field-effect transistor 104 of the charge pump 10 remains in the non-conductive state, while the n-channel field-effect transistor 105 of the charge pump 10 is rendered conductive during the time period when the output terminal Q2 of the second delay flip-flop 720 is the logic one. Accordingly, the capacitor 113 included in the low-pass filter 11 is discharged during the conduction period of the n-channel field-effect transistor 105.

Now consider a case where the phase of the input signal f1 advances as compared with the phase of the input signal f2. Since the first delay flip-flop 710 receives at the data terminal D1 thereof the logic one of the output $\overline{Q2}$ of the second delay flip-flop 720, the output terminal Q1 thereof becomes the logic one at the time t6, while the output terminal $\overline{Q1}$ becomes the logic zero. Accordingly, the p-channel field-effect transistor 104 included in the charge pump 10 is rendered conductive. Therefore, the capacitor 113 included in the low-pass filter 11 is discharged through the p-channel field-effect transistor 104 and the resistors 111 and 112 from the first reference potential such as $V_{DD}$. On the other hand, the output terminal Q2 of the second delay flip-flop 720 remains the logic zero. Accordingly, the n-channel field-effect transistor 105 included in the charge pump 10 remains in the non-conductive state. If and when the input signal f2 then rises as at the time t7 shown in FIG. 5, the first flip-flop 710 is reset and accordingly the output Q1 thereof becomes the logic zero while the output terminal $\overline{Q1}$ becomes the logic one. Accordingly, the p-channel field-effect transistor 104 included in the charge pump 10 returns to the non-conductive state, whereby a charging operation of the capacitor 113 in the low-pass filter 11 is terminated. On the other hand, since the second delay flip-flop 720 has been receiving at the data terminal D2 the logic zero of the output terminal $\overline{Q1}$ before the first delay flip-flop 710 is reset, the output terminal Q2 thereof remains the logic zero. Accordingly, the n-channel field-effect transistor 105 included in the charge pump 10 remains in the non-conductive state.

Thus, according to the FIG. 4 embodiment, when the phase of the input signal f1 advances as compared with the phase of the input signal f2, the p-channel field-effect transistor 104 included in the charge pump 10 is rendered conductive, whereby the capacitor 113 included in the low-pass filter 11 is charged, and conversely, when the phase of the input signal f2 advances as compared with the phase of the input signal f1, the n-channel field effect transistor 105 included in the charge pump 10 is rendered conductive, whereby the capacitor 113 included in the low-pass filter 11 is discharged. The above described condition is tabled in TABLE 2.

FIG. 6 is a graph showing how the phase locked loop is locked to a given frequency, wherein A is a graph showing a variation of the terminal voltage of the capacitor 113 included in the low-pass filter, B shows in an enlarged manner a portion marked B in A of FIG. 6 of the terminal voltage across the capacitor 113, and C shows in an enlarged manner a variation of a portion marked C in A of FIG. 6 of the terminal voltage across the capacitor 113. As shown in A of FIG. 6, as a variation of the terminal voltage across the capacitor 113 corresponding to the frequency to which the phase locked loop is to be locked is repeated in the positive going direction and the negative going direction, the phase locked loop is locked to that frequency. As shown in B of FIG. 6, at the beginning of the operation, the conduction period of the p-channel field-effect transistor 104 (or the n-channel field-effect transistor 105) of the charge pump 10 is rather long so that the charge or discharge amount is large, and immediately before the phase locked loop is locked, the conduction period of the field-effect transistor 104 or 105 is rather short and hence a charge or discharge amount is much less.

In case of a citizen band transceiver or an FM band radio receiver, the local oscillation frequency, i.e. the frequency of the voltage controlled oscillator (see FIG. 1) does not change to as high as twice the lowest frequency; however, in case of an MW band receiver, there could occur a frequency variation from the minimum frequency to the maximum frequency higher than twice the minimum frequency, at the least. Accordingly, if and when a phase locked loop is locked as if there were no phase difference even in case where the input signal f2 is of a frequency corresponding to a harmonic of the input signal f1, i.e. a phase locked loop is locked to an overtone, then a disadvantage results that erroneous tuning occurs in an automatic tuning apparatus. Therefore, heretofore a scheme for preventing such locking to an overtone has been provided in a phase comparator employed in a phase locked loop. Therefore, as understood from the foregoing description, problems are encountered that a circuit configuration becomes complicated, while a minor phase difference signal is liable to disappear, causing an error. According to the present invention, therefore, an edge extracting circuit is employed to achieve a function for preventing overtone locking. An edge extracting circuit is aimed to extract by a predetermined pulse width the edge portion being compared, such as a leading edge or a trailing edge of the input signal, in order to make small the duty cycle of the input signal.

FIG. 7 is a block diagram showing another embodiment of the present invention. The embodiment shown is different from the FIG. 4 embodiment in that edge extracting circuits 810 and 820 are connected before the input signal terminals 701 and 702. The edge extracting circuits 810 and 820 comprise inverters 811 and 821 for receiving the input signals f1 and f2, respectively. The outputs of the inverters 811 and 821 are each applied to other input of each of the AND gates 812 and 822 which are connected to receive, at one input of each thereof, the input signals f1 and f2, respectively. Capacitors 813 and 823 are connected to the output terminals of the inverters 811 and 821, respectively.

Before entering into the description of the operation of the embodiment shown, the operation of the edge extracting circuits 810 and 820 will be first described with reference to FIG. 8. Since both the edge extracting circuits 810 and 820 perform exactly the same operation, only one edge extracting circuit 810 will be described. Let it be assumed that the input signal f1 is applied to the input of the edge extracting circuit 810, as shown in FIG. 8A. The input signal f1 is as such applied to the AND gate 812 and is also applied to the other input of the AND gate 812 after the same is inverted by the inverter 811 and is further delayed by a capacitor 813. Accordingly, a signal as shown in FIG. 8C is obtained from the AND gate 812 during a time period when the output of the inverter 811 is delayed by the capacitor 813 and the same becomes below the threshold voltage of the AND gate 812. More specifically, the edge extracting circuit 810 is responsive to the leading edge rise of the input signal f1, thereby to provide a signal having a given width corresponding thereto.

Now on the assumption of the above described operation of the edge extracting circuits 810 and 820, the FIG. 7 embodiment will be described with reference to FIG. 9. Now let it be assumed that the input signals f1 and f2 are applied as shown in FIGS. 9A and 9B, respectively. Then the signals obtained at the outputs of the edge extracting circuits 810 and 820 and thus applied to the input terminals 701 and 702 of the phase comparator 7 are obtained as those extracted of only the edge portions of the input signals f1 and f2 as shown in FIGS. 9C and 9D, respectively. The outputs of the edge extracting circuits 810 and 820 are inputted through the input signal terminals 701 and 702 to the phase comparator 7. The phase comparator 7 performs exactly the same operation as described with reference to FIG. 4. Accordingly, waveforms of the signals at various portions are simply shown in FIG. 9, while a detailed description of the operation is omitted.

Figure 1:
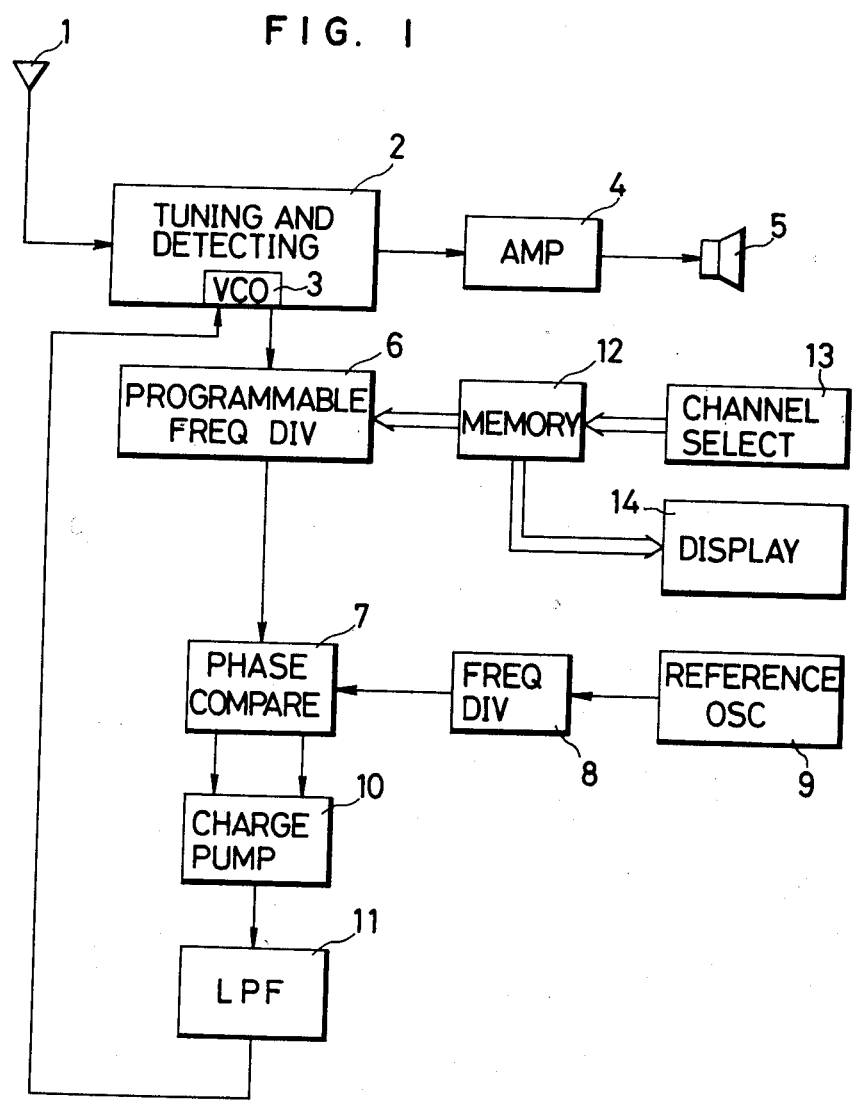
FIG. 1 is a block diagram showing one example of a radio receiver which constitutes the background of the present invention.

Meanwhile, in the FIG. 7 embodiment, the edge extracting circuits 810 and 820 were connected in the input signal terminals 701 and 702, respectively, because it was intended that erroneous locking be prevented, for example, the frequency of the signal f2 as frequency divided by the programmable frequency divider 6 with respect to the signal obtained from the voltage controlled oscillator 3 as shown in FIG. 1 is prevented from locking to the frequency below a reciprocal of the duty cycle, as described previously. More specifically, let it be assumed that the frequency of the signal f2 as frequency divided by the programmable frequency divider 6 shown in FIG. 1 is as high as twice the frequency of the reference signal f1 obtained from the reference oscillator 9 and thus from the frequency divider 8 and the duty cycle of the signal f1 is larger than 50 percent. In this case, a reset signal is applied to the respective reset terminals R1 and R2 of the delay flip-flops 710 and 720 of the phase comparator at the timing t1 shown in FIG. 10. Accordingly, both the outputs Q1 and Q2 of the delay flip-flops 710 and 720 become the logic zero. Now assuming that the pulse of the input signal f2 rises as shown in A of FIG. 10, then inherently the output terminal Q2 of the second delay flip-flop 720 must become the logic one; however, since at that time the reset terminal of the delay flip-flop 720 has been supplied with the logic one of the input signal f1 shown in A of FIG. 10, the output terminal Q2 of the second delay flip-flop 720 remains the logic zero. Accordingly, in spite of the fact that the frequency of the input signal f2 (B of FIG. 10) is as high as twice the frequency of the input signal f1 (A of FIG. 10), the phase comparator 7 does not provide any signal as if there is no phase difference, as shown in C and D of FIG. 10. Thus, when the cycle of the input signal f2 is shorter than the duty cycle of the input signal f1, then the delay flip-flops 710 and 720 are locked even in spite of the actual phase difference, with the result that the output terminals Q1 and Q2 both remain the logic zero. In order to prevent the above described overtone locking, edge extracting circuits are employed as in case of the FIG. 7 embodiment, so that at least one or both of the input signals f1 and f2 are processed such that the duty cycle thereof may be reduced.

FIG. 11 shows a state of the output terminals Q1 and Q2 of the delay flip-flops 710 and 720 in case where the edge extracting circuits 810 and 820 with respect to the input signals f1 and f2 of the same condition as shown in FIG. 10. As seen from FIG. 11, if and when the duty cycle of the input signal f1 is decreased by the use of the edge extracting circuit 810, a situation where the phase locked loop is locked to an overtone as described with reference to FIG. 10 can be prevented. Accordingly, insofar as there is a phase difference between the input signal f1 and the input signal f2, a signal associated with the phase difference is necessarily obtained either from the output terminal Q1 of the delay flip-flop 710 or the output terminal Q2 of the delay flip-flop 720. Thus, the FIG. 7 embodiment can prevent the phase locked loop from being locked to an overtone by reducing the duty cycle of the input signal by the use of an edge extracting circuit.

It is pointed out that such edge extracting circuits 810 and 820 may be connected to either or both of the reset terminals R1 and R2 of two delay flip-flops 710 and 720, respectively. The reason is that since the other delay flip-flop 720 is reset responsive to the input signal f1 and the delay flip-flop 710 is reset responsive to the input signal f2, the time period when the flip-flop is reset is limited only to the edge portion of the input signal, which prevents the phase locked loop from being locked to an overtone in the same manner.

FIG. 12 is a block diagram showing another embodiment wherein the edge extracting circuits as shown in FIG. 7 are connected to the reset terminal R1 of the delay flip-flop 710 and/or the reset terminal R2 of the delay flip-flop 720. The operation of such embodiment is similar to the above described operation, the difference only being that the reset signals applied to the reset terminals R1 and/or R2 are those extracted with respect to the edge portions of the input signals f2 and/or f1, and therefore a more detailed description of the operation will be omitted.

Figure 13:
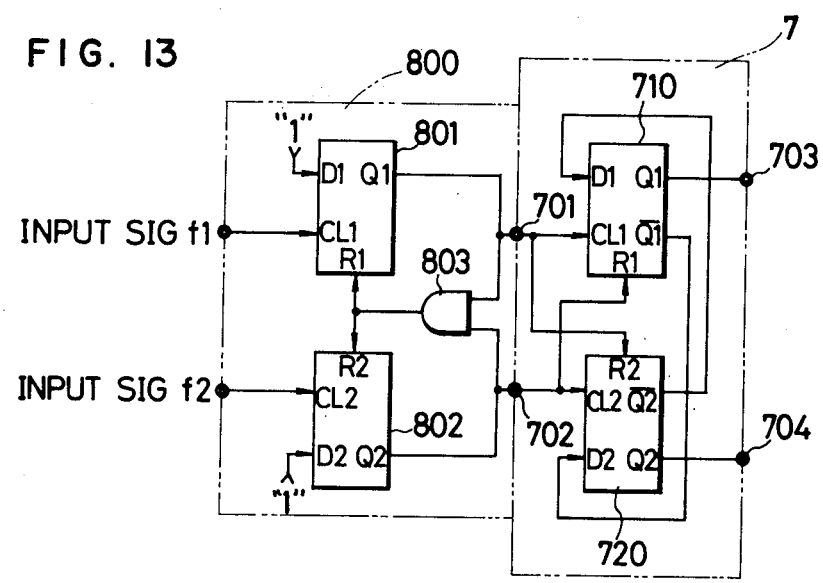
FIG. 13 is a block diagram showing a further embodiment of the present invention.

FIG. 13 is a block diagram showing a further embodiment of the present invention. The embodiment shown is aimed to achieve extraction of the edge portion in a digital manner by means of an edge extracting circuit 800. The edge extracting circuit comprises a set of delay flip-flops 801 and 802 and an AND gate 803. More specifically, the input signal f1 is applied to the clock terminal CL1 of the delay flip-flop 801 included in the edge extracting circuit 800 and the input signal f2 is applied to the clock terminal CL2 of the delay flip-flop 802 included in the edge extracting circuit 800. The output terminal Q1 of the delay flip-flop 801 and the output terminal Q2 of the delay flip-flop are both connected to the inputs of the AND gate 803. The output of the AND gate 803 is connected to the reset terminals R1 and R2 of the delay flip-flops 801 and 802, respectively. The data terminals D1 and D2 of the delay flip-flops 801 and 802, respectively, are supplied with the logic one. The signal obtained at the output terminal Q1 of the delay flip-flop 801 and the signal obtained at the output terminal Q2 of the delay flip-flop 802 are both applied to the input signal terminals 701 and 702 of the phase comparator 7, respectively.

Since the structural feature of the embodiment was described, now the operation thereof will be described with reference to FIG. 14. In the following description of the operation, the edge extracting operation of the edge extracting circuit 800 will be described in detail. When the input signals f1 and f2 are of the same phase as at the timing t1 shown in FIG. 14, the output terminals Q1 and Q2 of the delay flip-flops 801 and 802 included in the edge extracting circuit 800 both become the logic one. Therefore, the output of the AND gate receiving the signals obtained at the output terminals Q1 and Q2 becomes the logic one at the time t1 shown in FIG. 14, which is applied to the reset terminals R1 and R2 of the above described two delay flip-flops 801 and 802. Accordingly, the delay flip-flops 801 and 802 are reset, whereby the output terminals Q1 and Q2 become the logic zero.

Figure 14:
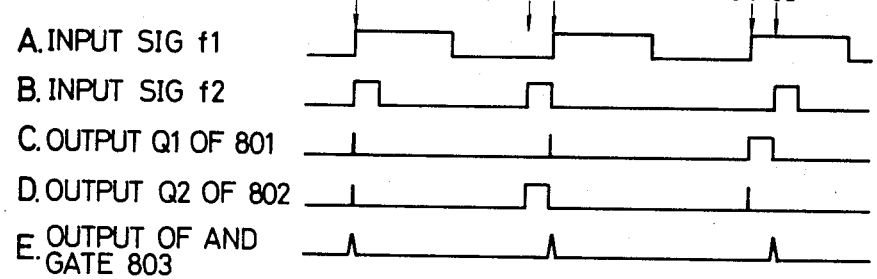
FIG. 14 is a graph showing waveforms of electrical signals at various portions of the FIG. 13 embodiment for explaining the operation thereof.

When the phase of the input signal f2 advances as compared with the phase of the input signal f1 as at the timing t2 shown in FIG. 14, the output terminal Q2 of the delay flip-flop 802 included in the edge extracting circuit 800 becomes the logic one, although the output terminal Q1 of the delay flip-flop 801 remains the logic zero. Accordingly, no signal is provided at the output of the AND gate 803 and thus at the reset terminals R1 and R2 and therefore the delay flip-flops 801 and 802 maintains the state. Thereafter, when the input signal f1 applied to the clock terminal CL1 of the delay flip-flop 801 rises as at the timing t3 shown in FIG. 14, the output terminal Q1 of the delay flip-flop 801 also becomes the logic one. Accordingly, a reset signal is applied to the reset terminals R1 and R2 from the AND gate 803 at the timing t3, whereby the output terminals Q1 and Q2 of the delay flip-flops 801 and 802 become the logic zero.

As at the time t4 shown in FIG. 14, when the phase of the input signal f1 advances as compared with the phase of the input signal f2, then the output terminal Q1 of the delay flip-flop 801 included in the edge extracting circuit 800 first becomes the logic one. However, the delay flip-flop 802 provides the logic zero at the output terminal Q2 thereof. Accordingly, the two delay flip-flops 801 and 802 maintain the state without being reset. Then as at the time t5 shown in FIG. 14, when the input signal f2 rises, the output terminal Q2 of the delay flip-flop 802 becomes the logic one. Therefore, the two delay flip-flops 801 and 802 are both reset at the time t5, whereupon the output terminals Q1 and Q2 thereof both become the logic zero. Thus, the signal as extracted by the edge extracting circuit 800 as shown in C and D of FIG. 14 are applied to the input signal terminals 701 and 702, respectively, of the phase comparator 7. Since the operation of the phase comparator 7 is the same as that of the embodiments shown in FIGS. 4 and 7, a more detailed description will be omitted.

Although in the FIG. 13 embodiment extraction of the edges being compared was made using the input signals f1 and f2 by means of the edge extracting circuit 800, edge extraction of the other input signal can be made without regard to one input signal by utilizing another clock signal.

Figure 15:
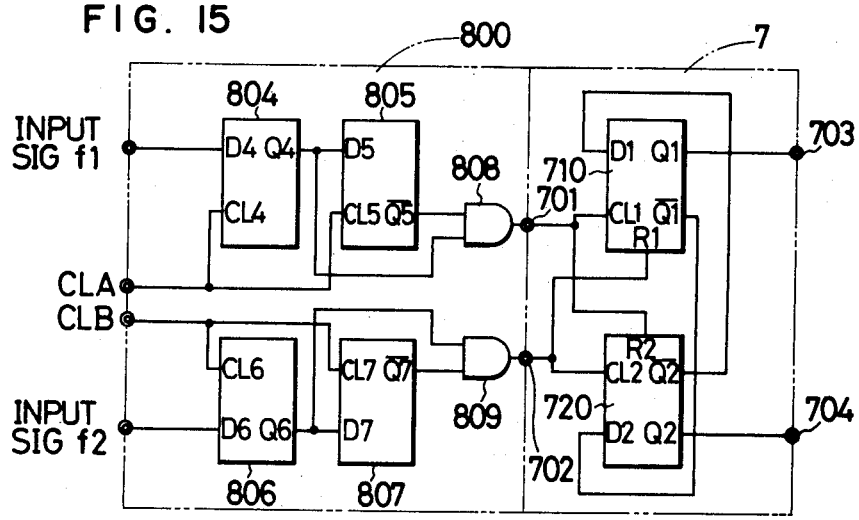
FIG. 15 is a block diagram of still a further embodiment of the present invention.

FIG. 15 is a block diagram showing a further embodiment of the present invention. The embodiment shown is a modification of the edge extracting circuit 800 as employed in the FIG. 13 embodiment. More specifically, the edge extracting circuit 800 of the FIG. 15 embodiment employs two sets of delay flip-flops 804 to 807 as cascade connected and AND gates 808 and 809. More specifically, the input signal f1 is applied to the data terminal t4 of the delay flip-flop 804 included in the edge extracting circuit 800 and the second input signal f2 is applied to the data terminal D6 of the delay flip-flop 806. The clock signal CLA is applied to the clock terminals CL4 and CL5 of the delay flip-flops 804 and 805, respectively, and the clock signal CLB is applied to the clock terminals CL6 and CL7 of the delay flip-flops 806 and 807, respectively. The signal obtained at the output terminal Q4 of the delay flip-flop 804 is applied to the data terminal D5 of the delay flip-flop 805 and is also applied to one input of the AND gate 808. Similarly, the signal obtained at the output terminal Q6 of the delay flip-flop 806 is applied to the data terminal D7 of the delay flip-flop 807 and is also applied to the one input of the AND gate 809. The signal obtained at the output terminal $\overline{Q5}$ of the delay flip-flop 805 is applied to the other input of the AND gate 808 and the signal obtained at the output terminal $\overline{Q7}$ of the delay flip-flop 807 is applied to the other input of the AND gate 809. The output signal of the AND gate 808 is applied to the input signal terminal 701 and the output signal of the AND gate 809 is applied to the input signal terminal 702.

Figure 16:
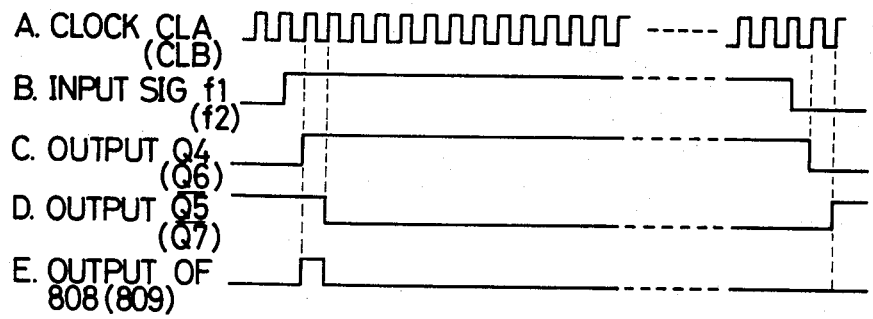
FIG. 16 is a graph showing waveforms of electrical signals at various portions of the FIG. 15 embodiment for explaining the operation thereof.

Since the structural feature of the embodiment was described in the foregoing, the operation of the FIG. 15 embodiment will be described with reference to FIG. 16. Since in the FIG. 15 embodiment the circuit associated with the input signal f1 and the circuit associated with the input signal f2 of the edge extracting circuit 800 perform exactly the same operation, in the following only the operation of the circuit associated with the input signal f1, i.e. the operation of the delay flip-flops 804 and 805 and the AND gate 808 will be described. Now let it be assumed that the input signal f1 is applied as shown in B of FIG. 16. In such a situation, let it be further assumed that a signal as shown in A of FIG. 16, for example, is applied to the clock terminal CL4 of the delay flip-flop 804 as a clock signal CLA. Then, the output terminal Q of the delay flip-flop 804 becomes the logic one responsive to the rise of the clock signal CLA applied to the clock terminal CL4. Since at that time the output terminal $\overline{Q5}$ of the delay flip-flop 805 is the logic one, the two inputs of the AND gate 808 both become the logic one and accordingly the output signal also becomes the logic one. The output terminal $\overline{Q4}$ of the delay flip-flop also becomes the logic one and, when the clock signal CLA is again applied to the clock terminal CL5 of the delay flip-flop 805, in such a situation that the data terminal D5 of the delay flip-flop 805 is maintained in the logic one, the output terminal $\overline{Q5}$ thereof is reversed to the logic zero. Accordingly, the output of the AND gate 808 becomes the logic zero at the time point, with the result that the output of the AND gate 808 provides a pulse signal as shown in E of FIG. 16. Thus, the pulse signal obtained from the AND gate 808 is applied to the input signal terminal 701 of the phase comparator 7. Similarly, the output pulse signal obtained from the AND gate 809 is also applied to the input signal terminal 702. Therefore, the phase comparator 7 performs a phase comparing operation based on the outputs thus obtained from the edge extracting circuit 800. Since the phase comparing operation was previously described in more detail, a detailed description is omitted. Thus, it would be appreciated that it is assured that the phase locked loop is prevented from being locked to an overtone by changing the duty cycle of the input signals.

Figure 17:
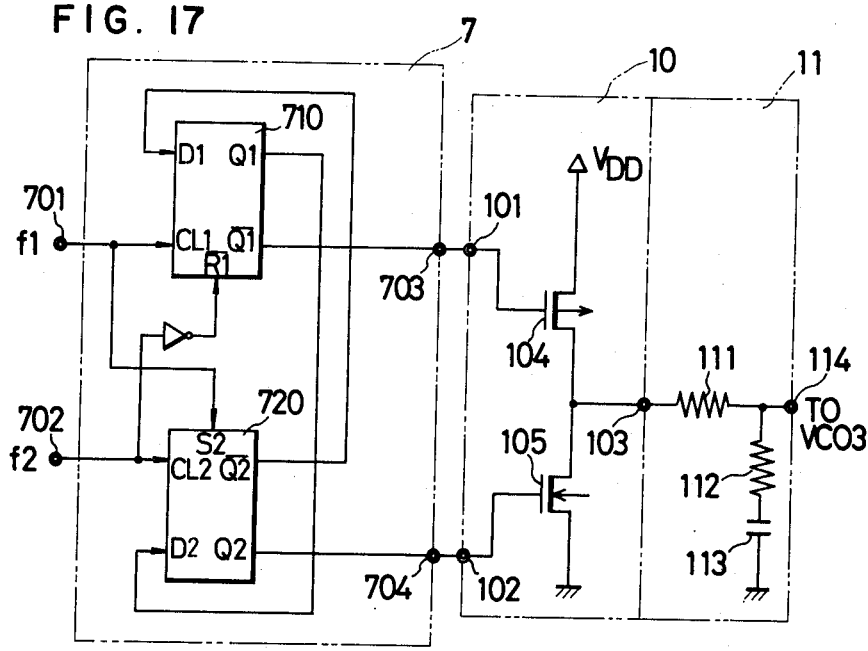
FIG. 17 is a block diagram of still a further embodiment of the present invention.

FIG. 17 is a block diagram showing still a further embodiment of the present invention. The embodiment shown is different from the FIG. 4 embodiment in that an inversion of the second input signal f2 is applied to the reset terminal $\overline{R1}$ of the first delay flip-flop 710 and the input signal f1 is applied to the set terminal S2 of the second delay flip-flop f20. The other operation thereof is the same as that of the FIG. 4 embodiment.

Figure 18:
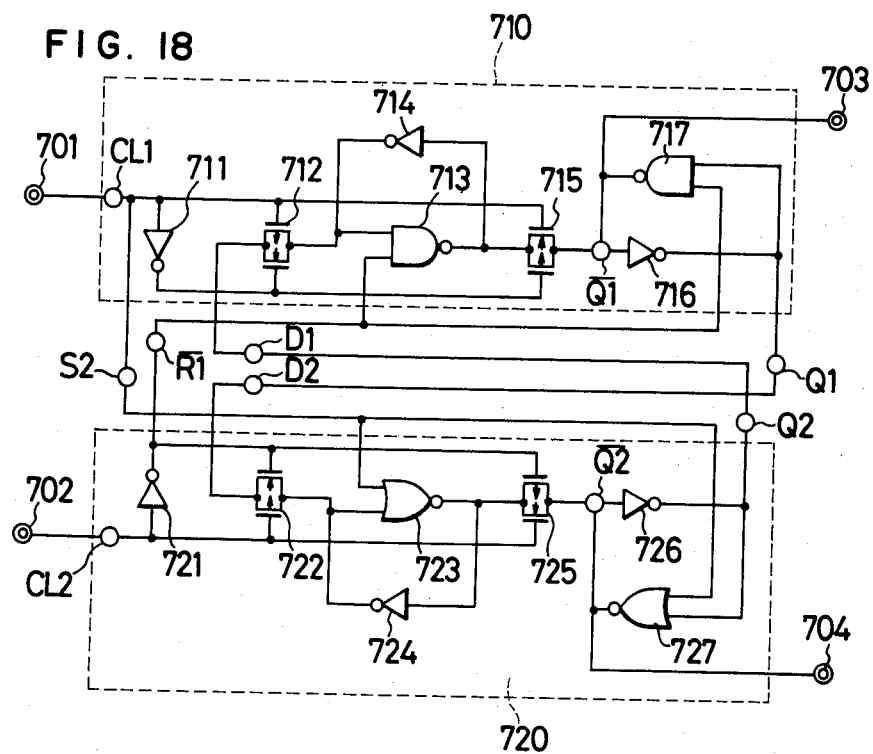
FIG. 18 is a schematic diagram more specifically showing the FIG. 17 embodiment.

FIG. 18 is a schematic diagram showing in more detail the FIG. 17 embodiment. FIG. 18 particularly shows in detail the delay flip-flops 710 and 720. It is pointed out that the delay flip-flops used in the embodiments of FIGS. 4, 7, 12, 13 and 15 also may be structured as shown in FIG. 18. Accordingly, in FIG. 18 like portions have been denoted by the same reference characters as those used for the previously described embodiments.

The delay flip-flop 710 has the clock terminal CL1 for receiving an input signal from the input signal terminal 701. The signal obtained at the clock terminal CL1 is applied to one control signal of transfer gates 712 and 715 and an inversion thereof by means of an inverter 711 is applied as the other control signal of these transfer gates 712 and 715. The data terminal D1 receiving the signal obtained at the output terminal Q2 of the second delay flip-flop 710 is connected as another input of the transfer gate 712. The output of the transfer gate 712 is applied to one input of the NAND gate 713. The other input of the NAND gate 713 is connected to receive the signal obtained from the reset terminal $\overline{R1}$ receiving an inversion of the second input signal f2. The signal obtained from the reset terminal $\overline{R1}$ is further applied to one input of the NAND gate 717. The output of the NAND gate 713 is applied to one input of the transfer gate 715 and is fed back through an inverter 714 to the output of the transfer gate 712 and thus to one input of the NAND gate 713. The output of the transfer gate 715 is the same signal as obtained at the output terminal $\overline{Q1}$, which is connected through an inverter 716 to the output terminal Q1 and is also applied to the other input of the above described NAND gate 717. The output of the NAND gate 717 is fed back to the output of the transfer gate 715 and thus to the output terminal $\overline{Q1}$. The output terminal $\overline{Q1}$ is connected to the gate of the p-channel field-effect transistor 104 included in the charge pump 10.

On the other hand, the second delay flip-flop 720 is different from the first delay flip-flop 710 only in that the NAND gates 713 and 717 of the first delay flip-flop 710 are replaced by NOR gates 723 and 727 and the signal of the first input signal terminal 701 is directly inputted. The output of the second transfer gate 725, i.e. the output terminal $\overline{Q2}$ is directly connected to the gate of the n-channel field-effect transistor 105 included in the charge pump 10.

Since the structural feature of the embodiment was described, the operation of the FIG. 18 embodiment will be described with reference to FIG. 19. In operation, first let it be assumed that the first and second input signals f1 and f2 are applied as shown in A and B of FIG. 19, respectively.

Figure 19:
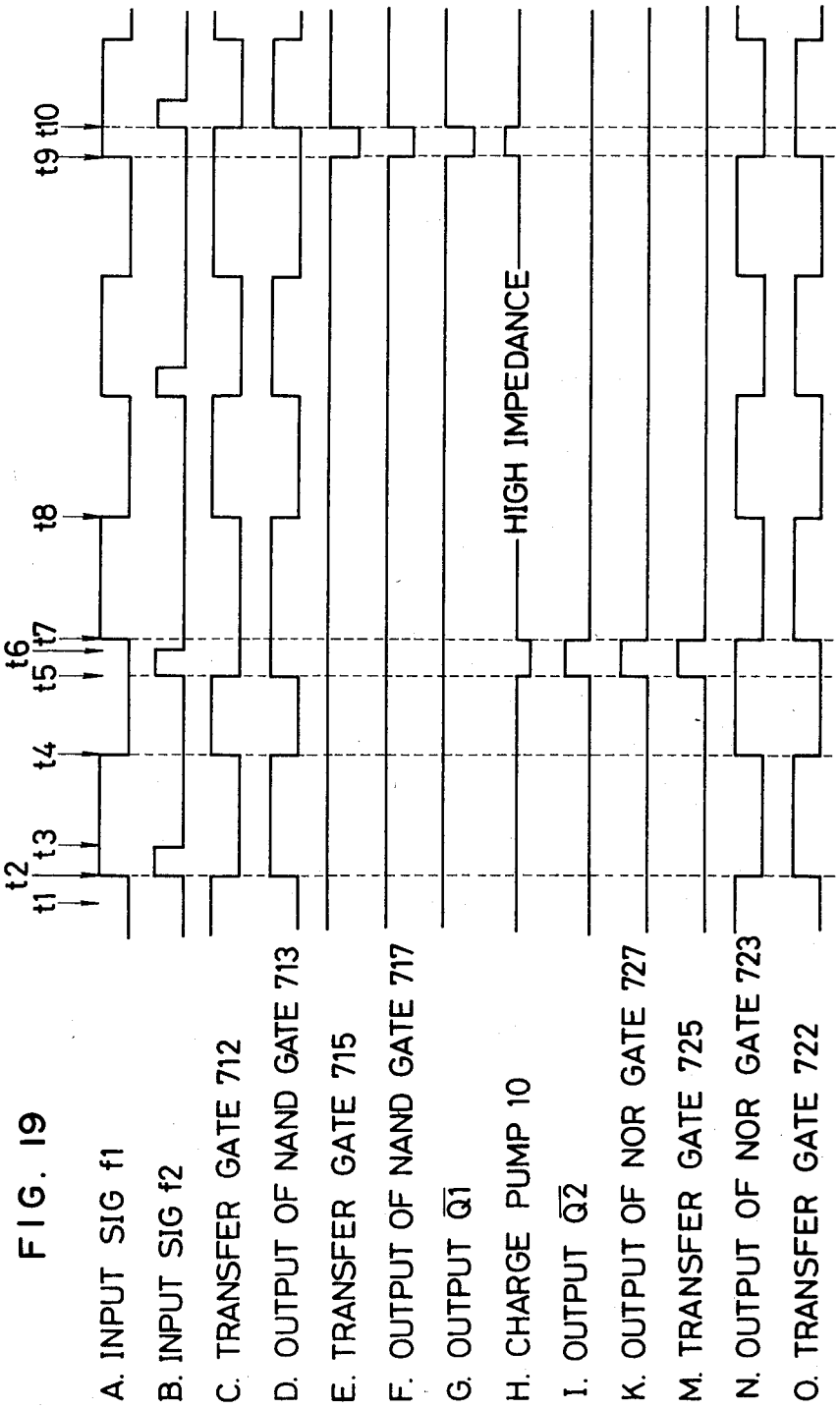
FIG. 19 is a graph showing waveforms of electrical signals at various portions of the FIG. 18 embodiment for explaining the operation thereof.

Further let it be assumed that the input signals f1 and f2 are both the logic zero as the timing t1 shown in FIG. 19. At that time the transfer gate 712 included in the delay flip-flop 710 and the transfer gate 722 included in the delay flip-flop 720 are both rendered conductive and conversely the transfer gate included in the delay flip-flop 710 and the transfer gate 725 included in the delay flip-flop 720 are both rendered non-conductive. Accordingly, the output terminal $\overline{Q1}$ of the delay flip-flop 710 and the output terminal $\overline{Q2}$ of the delay flip-flop 720 are the logics one and zero, respectively. Accordingly, the two field-effect transistors 104 and 105 included in the charge pump 10 are both rendered non-conductive, thereby to exhibit a high impedance.

Now let it be assumed that the input signals f1 and f2 both rise to the logic one as at the timing t2 shown in FIG. 19. Then, both the transfer gates 712 and 722 are rendered non-conductive as shown in C and D of FIG. 19, respectively. On the other hand, the second transfer gates 715 and 725 are both rendered conductive as shown in E and M of FIG. 19, respectively. Therefore, at least one of the inputs to the NAND gates 713 and 717 becomes the logic zero and the output of the NAND gates 713 and 714 becomes the logic one, as shown in D and F of FIG. 19. Since at least one of the inputs to the NOR gates 723 and 727 becomes the logic one, the outputs thereof become the logic zero as shown in N and K of FIG. 19, respectively. Accordingly, the charge pump 10 remains in the high impedance as shown in H of FIG. 19. Since the transfer gate 712 is rendered non-conductive insofar as the input signal f1 is the logic one, the output of the NAND gate 713 is fed through the inverter 714 to the input thereof and the output of the NAND gate 713 is maintained in the logic one. The transfer gate 722 is rendered non-conductive insofar as the input signal f2 is the logic one and the output of the NOR gate 723 is fed back through the inverter 724 to the input thereof, so that the output of the NOR gate 723 is maintained in the logic zero state.

Then only the input signal f2 turns from the logic one to the logic zero as at the timing t3 shown in FIG. 19. Then the transfer gate 722 included in the delay flip-flop 720 is rendered conductive, while the transfer gate 725 is rendered non-conductive. Since the signal of the logic zero obtained from the first delay flip-flop 710 have been applied to the transfer gate 722 through the data terminal D2, the output of the transfer gate 722 becomes the logic zero. However, since the input signal f1 remains the logic one, the other input of the NOR gate 723, i.e. the signal obtained at the set terminal S2 remains the logic one. Accordingly, the output of the NOR gate 723 remains the logic zero as shown in N of FIG. 19. In such a situation, the input signal f1 also changes from the logic one to the logic zero as at the timing t4 shown in FIG. 19. Then, the transfer gate 712 included in the delay flip-flop 710 is rendered conductive. Accordingly, the signal of the logic one obtained at the output terminal Q2 of the delay flip-flop 720 is applied as an input to the NAND gate 713. The other input of the NAND gate 713 has been supplied with the signal of the logic one through the reset terminal $\overline{R1}$ from the inverter 712. Accordingly, the output of the NAND gate 713 becomes the logic zero as at the time t4 as shown in D of FIG. 19. Since the two inputs of the NAND gate 723 included in the delay flip-flop 720 both become the logic zero, the output of the gate 723 becomes the logic one as at the timing t4 as shown in N of FIG. 19.

Then the first input signal f1 remains the logic zero, while only the second input signal f2 becomes the logic one as at the timing t5 shown in FIG. 19. Then the transfer gate 722 is rendered non-conductive, while the transfer gate 725 is rendered conductive. Accordingly, the output of the transfer gate 725, i.e. the output terminal $\overline{Q2}$ is supplied with the output of the logic one from the NOR gate 723, so that the same becomes the logic one as at the time t5 as shown in K of FIG. 2. Accordingly, the n-channel field-effect transistor 105 included in the charge pump 10 is rendered conductive. Accordingly, the capacitor (not shown in FIG. 18) included in the low-pass filter is discharged.

When the second input signal f2 again becomes the logic zero as at the time t6 shown in FIG. 19, the transfer gate 722 is rendered conductive, while the transfer gate 725 is rendered non-conductive. However, since the signal obtained at the output terminal $\overline{Q2}$ is maintained by virtue of a feedback loop formed by the inverter 726 and the NOR gate 727 even if the transfer gate 725 is rendered non-conductive, the previous state of the logic one is maintained. Accordingly, the n-channel field effect transistor 105 of the charge pump 10 is also maintained in the conductive state. However, when the input signal f1 becomes the logic one as at the time t7 shown in FIG. 19, the outputs of the NOR gates 723 and 727 become the logic zero and the signal of the output terminal $\overline{Q2}$ becomes the logic zero. Accordingly, the n-channel field-effect transistor 105 included in the charge pump 10 is rendered non-conductive at the time t7. At that time, the transfer gate 712 is in the non-conductive state and the output of the NAND gate 713 is the logic zero. Accordingly, the output terminal $\overline{Q1}$ is maintained in the logic one state even when the transfer gate 715 is rendered conductive and the p-channel field-effect transistor 104 included in the charge pump 10 is maintained in the non-conductive state. When the input signal f1 again becomes the logic zero as at the time t8 shown in FIG. 19, one input of each of the NOR gates 723 and 727 becomes the logic zero. Accordingly, the output of the NOR gate 723 becomes the logic one at the time t8 as shown in N of FIG. 19. Since the transfer gate 712 is rendered conductive and one input of the NAND gate 713 is supplied with the signal of the logic one obtained at the output terminal Q2 of the other delay flip-flop 720, the output of the NAND gate 713 becomes the logic zero at the time t8 as shown in D of FIG. 19.

Now consider a case where the phase of the input signal f1 advances as compared with the phase of the input signal f2. When the input signal f2 is the logic zero as at the time t9 shown in FIG. 19, the first input signal f1 rises to the logic one. Then, the transfer gate 12 is rendered non-conductive, while the transfer gate 715 is rendered conductive. Then the output signal of the NAND gate 713 at that time, i.e. the logic zero (see D of FIG. 19) is transferred through the transfer gate 715 to the output terminal $\overline{Q1}$ of the delay flip-flop 710 as shown in E of FIG. 19. Accordingly, the p-channel field-effect transistor 104 included in the charge pump 10 is rendered conductive and the capacitor (not shown) included in the low-pass filter is charged. Thereafter the input signal f2 becomes the logic one as at the time t10 shown in FIG. 19. Then one input of the NAND gate 717 becomes the logic zero and the output terminal $\overline{Q1}$ becomes the logic one, so that the p-channel field-effect transistor 104 included in the charge pump 10 is rendered non-conductive.

Thus, when the phase of the input signal f1 is delayed as compared with the phase of the input signal f2, the signal is obtained from the output terminal $\overline{Q2}$ and conversely when the phase of the input signal f1 advances as compared with the phase of the input signal f2, the signal is obtained from the output terminal $\overline{Q1}$. Accordingly, it is sufficient to control the charge pump 10 in association with the signal obtained from the phase comparator 7.

Since in the FIG. 18 embodiment a state storing loop is formed by the inverter 714 (724) and the NAND gate 717 (NOR gate 727), an electric charge stored in the capacitor included in the low-pass filter 11 does not leak in the locked state. Without such a storing loop, the capacitor 113 would have leaked and an electric charge would have decreased even in the locked state. If an electric charge in the capacitor 113 would have decreased, the frequency of the phase locked loop and thus of the voltage controlled oscillator 3 would have slightly drifted. Such a drift of the frequency would have degraded a spurious response of a receiver like an image signal. However, according to the embodiment shown, such a storing loop as described in the foregoing is provided and therefore the charge pump 10 exhibits approximately an infinite high impedance in case of the locked state of a phase locked loop, with the result that an electric charge of the capacitor 113 does not leak and thus the frequency is stabilized without causing a slight drift. However, it is pointed out that the present invention can be applied to a case where such a storing loop is not employed.

Figure 20:
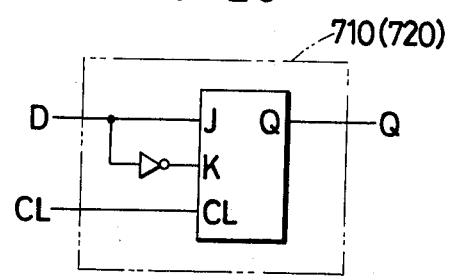
FIGS. 20 and 21 are block diagrams for illustrating other examples of signal processing circuits which are to be substituted for the delay flip-flop.

Although in the above described embodiments delay flip-flops were employed as the first and second signal processing circuits, it is pointed out that insofar as the requirements shown in the truth table of TABLE 1 are met, any other types of flip flops may be employed. FIG. 20 shows an instance wherein J-K flip-flops are utilized as another type of signal processing circuits. The truth table of the J-K flip-flop is well known to those skilled in the art and is shown in TABLE 3. Accordingly, when an inversion of the J input is connected to the K input, the same conditions as those of the delay flip-flops as shown in TABLE 1 can be achieved even by a J-K flip-flop and hence J-K flip-flops can be used in place of delay flip-flops for the purpose of the present invention.

Figure 21:
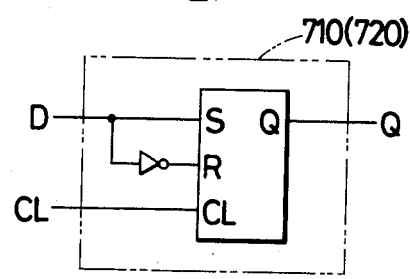

FIG. 21 shows an instance wherein R-S flip-flops are used in place of delay flip-flops to implement the present invention. The truth table of an R-S flip-flop is also well known to those skilled in the art and is shown in TABLE 4. Accordingly, by connecting an inversion of the S input to the R input, the same conditions as those of a delay flip-flop can be achieved even by using an R-S flip-flop. Thus, R-S flip-flops can also be used in place of delay flip-flops.

Figure 22:
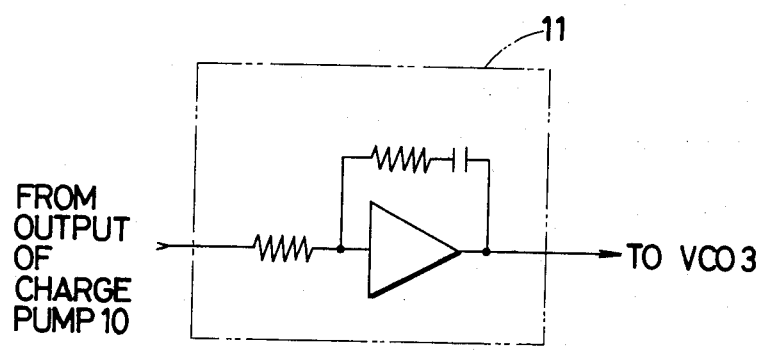
FIG. 22 is a schematic diagram showing another example of the low-pass filter in case where the present invention is employed in a phase locked loop.

FIG. 22 is a schematic diagram of another embodiment of the low-pass filter 11 in case where the present invention is employed in a phase locked loop. The low-pass filter 11 as shown is known as the so-called active filter.

Although the present invention has been described and illustrated in detail, it is to be clearly understood that the same is by way of illustration and example only and is not to be taken by way of limitation, the spirit and scope of the present invention being limited only by the terms of the appended claims.

TABLE 1

| CL | D | R | Q |
|---|---|---|---|
| ↑ | 1 | 0 | 1 |
| ↑ | 0 | 0 | 0 |
| ↑ | x | 0 | NC | x - Don't care
NC - No change

TABLE 2

| Phase | Output Q1 of 710 | Output Q2 of 720 | Capacitor 113 of 11 |
|---|---|---|---|
| f2 > f1 | 0 | 1 | Discharge |
| f1 > f2 | 1 | 0 | Charge |
| f1 = f2 | 0 | 0 | — |

TABLE 3

| CL | J | K | Q |
|---|---|---|---|
| ↑ | 0 | 0 | NC |
| ↑ | 0 | 1 | 0 |
| ↑ | 1 | 0 | 1 |
| ↑ | 1 | 1 | $\overline{Q}$ |
| ↓ | x | x | NC |

(middle three rows: restricted to this portion)

X - Don't care
NC - No change

TABLE 4

| CL | R | S | Q |
|---|---|---|---|
| ↑ | 0 | 0 | NC |
| ↑ | 0 | 1 | 1 |
| ↑ | 1 | 0 | 0 |
| ↑ | 1 | 1 | x |
| ↓ | x | x | NC |

(middle three rows: restricted to this portion)

x - Don't care
NC - No Change

What is claimed is:

1. An apparatus for comparing the phases of two input signals, comprising:

first and second signal processing circuit means, each including first, second and third input terminals, and first and second output terminals, each of said first and second signal processing circuit means being structured such that said signal processing circuit means is responsive to a signal obtained at said first input terminal for transferring a signal obtained at said third input terminal to said first and second output terminals in a reversed logical relation and is responsive to a signal obtained at said second input terminal for forcing said first and second output terminals to a logical state determined by said signal obtained at said second input terminal, first input signal providing means for providing a first input signal the phase of which is to be compared to said first input terminal of said first signal processing circuit means, second input signal providing means for providing a second input signal the phase of which is to be compared to said first input terminal of said second signal processing circuit means, first signal supplying means for supplying the signal obtained at said first input terminal of said first signal processing circuit means to said second input terminal of said second signal processing circuit means, second signal supplying means for supplying the signal obtained at said first input terminal of said second signal processing circuit means to said second input terminal of said first input processing circuit means, third signal supplying means for supplying the signal obtained at said first or second output terminal of said first signal processing circuit means to said third input terminal of said second processing circuit means, and fourth signal supplying means for supplying the signal obtained at said first or second output terminal of said second signal processing circuit means to said third input terminal of said first signal processing circuit means.

2. An apparatus for comparing the phases of two input signals in accordance with claim 1, wherein said second signal supplying means is adapted to supply the signal obtained at said first input terminal of said second signal processing circuit means directly to said second input terminal of said first signal processing circuit means.

3. An apparatus for comparing the phase of two input signals in accordance with claim 1, wherein said second signal supplying means is adapted to supply the signal obtained at said first input terminal of said second signal processing circuit means to said second input terminal of said first signal processing circuit means after inversion of said signal.

4. An apparatus for comparing the phases of two input signals in accordance with claim 1, which further comprises
time constant circuit means, and
charge/discharge controlling means responsive to said signal obtained at either said first or second output terminal of said first signal processing circuit means and said signal obtained at either said first or second output terminal of said second signal processing circuit means for controlling charge/discharge of said time constant circuit means.

5. An apparatus for comparing the phases of two input signals in accordance with claim 4, wherein said charge/discharge controlling means comprises first and second semiconductor switching means connected in series, each having control electrode means, one electrode means and the other electrode means,
said first semiconductor switching means has said control electrode means connected to either said first or second output terminal of said first signal processing circuit means,
said second semiconductor switching means has said control electrode means connected to either said first or second output terminal of said second signal processing circuit means,
one end of said series connection of said first and second semiconductor switching means is connected to first reference potential means and the other end of said series connection of said first and second semiconductor switching means is connected to second reference potential means, and
the junction of said series connection of said first and second semiconductor switching means is connected to said time constant circuit means.

6. An apparatus for comparing the phases of two input signals in accordance with claim 5, wherein each said semiconductor switching means comprises field-effect transistor means.

7. An apparatus for comparing the phases of two input signals in accordance with claim 6, wherein said first and second field-effect transistor means are structured in a complementary combination.

8. An apparatus for comparing the phases of two input signals in accordance with either of claims 1 or 7, which further comprises edge extracting means provided associated with at least one of said two input signals for extracting an edge portion of the corresponding input signal the phase of which is to be compared.

9. An apparatus for comparing the phases of two input signals in accordance with claim 8, wherein said edge extracting means is interposed in at least one of a connection between said first input terminal of said first signal processing circuit means and said first input signal providing means and a connection between said first input terminal of said second signal processing circuit means and said second input signal providing means.

10. An apparatus for comparing the phases of two input signals in accordance with claim 8, wherein said edge extracting means is interposed in series with at least one of said first signal supplying means and said second signal supplying means.

11. An apparatus for comparing the phases of two input signals in accordance with claim 8, wherein said first input signal of said two input signals has a predetermined fixed duty cycle, and said edge extracting means is provided associated with said first input signal.

12. An apparatus for comparing the phases of two input signals in accordance with claim 1, wherein said first and second signal processing circuit means comprise first and second signal transfer path means, respectively,
said first signal transfer path means transfers the signal obtained at said third input terminal to said second signal transfer path means in a first logical state of said signal obtained at said first input terminal,
said second signal transfer path means transfers the signal transferred from said first signal transfer path means to said first and second output terminals in a second logical state of said signal obtained at said first input terminal, and which further comprises
first logical state forcing means responsive to the signal obtained at said second input terminal for forcing the output of said signal transfer path means to a predetermined logical state, and
second logical state forcing means responsive to the signal obtained at said second input terminal for forcing the output of said second signal transfer path means to a predetermined logical state.

13. An apparatus for comparing the phases of two input signals in accordance with claim 12, which further comprises holding means provided associated with said first logical state forcing means for holding the output of said first signal transfer path means.

14. An apparatus for comparing the phases of two input signals in accordance with claim 13, wherein said holding means comprises feedback path means for feeding back from the input of said second signal transfer path means to the output of said first signal transfer path means.

15. An apparatus for comparing the phases of two input signals in accordance with claim 13, wherein said second logical state forcing means is structured to be further responsive to the output of said second logical state forcing means for forcing the output of said second signal transfer path means to said predetermined logical state.

16. An apparatus for comparing the phases of two input signals in accordance with claim 12, which further comprises
time constant circuit means, and
charge/discharge controlling means responsive to the signal obtained at either said first or second output terminal of said first signal processing circuit means and the signal obtained at either said first or second output terminal of said second signal processing circuit means for controlling charge/discharge of said time constant circuit means.

17. An apparatus for comparing the phases of two input signals in accordance with claim 16, wherein
said charge/discharge controlling means comprises first and second field-effect transistor means connected in series, each said field-effect transistor means comprising gate electrode means, and
one end of said series connection of said first and second field-effect transistor means is connected to first reference potential means and the other end of said series connection of said first and second field-effect transistor means is connected to second reference potential means, the junction of said series connection of said first and second field-effect transistor means being connected to said time constant circuit means.

18. An apparatus for comparing the phases of two input signals in accordance with claim 17, wherein said first and second field-effect transistor means are structured in a complementary relation, either said first or second output terminal of said first signal processing circuit means is connected directly to said gate electrode of said first field-effect transistor means, and either said first or second output terminal of said second signal processing circuit means is directly connected to said gate electrode of said second field-effect transistor means.

19. An apparatus for comparing the phases of two input signals in accordance with claim 18, wherein said first field-effect transistor means is rendered conductive responsive to the output of said second signal transfer path means of said first signal processing circuit means if and when the phase of said first input signal advances as compared with the phase of said second input signal, and said second field-effect transistor means is rendered conductive responsive to the output of said second signal transfer path means of said second signal processing circuit means if and when the phase of said second input signal advances as compared with the phase of said first input signal.

20. An apparatus for comparing the phases of two input signals in accordance with claim 18, wherein said first and second signal processing circuit means are structured in a reversed logical relation.

21. An apparatus for comparing the phases of two input signals in accordance with claim 12, wherein said first and second signal transfer path means of said first and second signal processing circuit means, respectively, each comprises first and second transfer gate means on/off controllable responsive to the signal obtained at said first input terminal, said first logical state forcing means of said first signal processing circuit means comprises first NAND gate means connnected to receive said signal obtained at said second input terminal and the output of said first transfer gate means for supplying an output thereof to said second transfer gate means, said first logical state forcing means of said second signal processing circuit means comprises first NOR gate means connected to receive said signal obtained at said first input terminal and the output of said first transfer gate means for supplying an output thereof to said second transfer gate means, and said second logical state forcing means of said first signal processing circuit means comprises inverter means for inverting the output of said second transfer gate means, and second NAND gate means connected to receive the output of said first inverter means and the signal obtained at said second input terminal for supplying an output thereof to the output of said second transfer gate means, said second logical state forcing means of said second signal processing circuit means comprises inverter means for inverting the output of said second transfer gate means, and second NOR gate means connected to receive the output of said inverter means and the signal obtained at said second input terminal for supplying an output thereof to the output of said second transfer gate means, said first NAND gate means of said first signal processing circuit means and said first NOR gate means of said second signal processing circuit means each comprise feedback loop means including inverter means, and said third input terminals of said first and second signal processing circuit means are connected to the inputs of the corresponding transfer gate means, respectively, and which further comprises first feed means for feeding the output of said inverter of said second logical state forcing means of said second signal processing circuit means to said third input terminal of said first signal processing circuit means, and second feed means for feeding the output of said inverter of said second logical state forcing means of said first signal processing circuit means to said third input terminal of said second signal processing circuit means.

22. An apparatus for comparing the phases of two input signals in accordance with claim 21, wherein said charge/discharge controlling means comprises first and second field-effect transistor means connected in series, each said field-effect transistor means comprising gate electrode means, one end of said series connection of said first and second field-effect transistor means is connected to first reference potential means and the other end of said series connection of said first and second field-effect transistor means is connected to second reference potential means, the junction of said series connection of said first and second field-effect transistor means being connected to said time constant circuit means, the gate electrode means of said first field-effect transistor means is connected to the output of said second transfer gate means of said first signal processing circuit means, and the gate electrode means of said second field-effect transistor means is connected to the output of said second transfer gate means of said second signal processing circuit means.

23. An apparatus for comparing the phases of two input signals in accordance with claim 22, wherein each said transfer gate means, each said NAND gate means, each said NOR gate means and each said inverter means are implemented by complementary field-effect transistor means.

24. An apparatus for comparing the phases of two input signals in accordance with claim 23, wherein said first field-effect transistor means is a p-channel type and said second field-effect transistor means is an n-channel type.

* * * * *